(12) United States Patent
Li

(10) Patent No.: US 6,724,224 B1
(45) Date of Patent: Apr. 20, 2004

(54) BUS RELAY AND VOLTAGE SHIFTER WITHOUT DIRECTION CONTROL INPUT

(75) Inventor: Xianxin Li, Milpitas, CA (US)

(73) Assignee: Pericom Semiconductor Corp., San Jose, CA (US)

(*) Notice: Subject to any disclaimer, the term of this patent is extended or adjusted under 35 U.S.C. 154(b) by 0 days.

(21) Appl. No.: 10/249,413

(22) Filed: Apr. 7, 2003

(51) Int. Cl.[7] .................. H03K 19/0175; H03K 19/00
(52) U.S. Cl. .................. 326/82; 326/56; 326/93
(58) Field of Search .................. 326/82–83, 56–58, 326/93; 327/108, 109, 141, 161

(56) References Cited

U.S. PATENT DOCUMENTS

| | | | |
|---|---|---|---|
| 5,084,637 A | 1/1992 | Gregor | 326/81 |
| 5,107,257 A | 4/1992 | Fukuda | 370/451 |
| 5,194,764 A | * 3/1993 | Yano et al. | 326/86 |
| 5,214,330 A | 5/1993 | Okazaki | 326/90 |
| 5,300,835 A | 4/1994 | Assar et al. | 326/68 |
| 5,424,659 A | 6/1995 | Stephens et al. | 326/81 |
| 5,485,458 A | 1/1996 | Oprescu et al. | 370/409 |
| 5,521,531 A | 5/1996 | Okuzumi | 326/81 |
| 5,672,983 A | * 9/1997 | Yamamoto et al. | 326/27 |
| 5,680,064 A | 10/1997 | Masaki et al. | 326/81 |
| 5,808,492 A | * 9/1998 | Chow | 327/108 |
| 5,999,389 A | 12/1999 | Luebke et al. | 361/68 |
| 6,072,342 A | 6/2000 | Haider et al. | 327/112 |
| 6,127,849 A | 10/2000 | Walker | 326/86 |
| 6,163,170 A | 12/2000 | Takinomi | 326/81 |

FOREIGN PATENT DOCUMENTS

JP    06052093 A    * 2/1994    ........... G06F/13/36

OTHER PUBLICATIONS

MAX3370 Data Sheet, Maxim Corp., 2/01, pp. 1–10.*

* cited by examiner

*Primary Examiner*—James H Cho
(74) *Attorney, Agent, or Firm*—Stuart T. Auvinen

(57) ABSTRACT

A bi-directional bus-interface chip has no direction-control input. A forward buffer and a reverse buffer are both normally disabled in the high-impedance state. When a transition occurs on one input bus, a driver transistor in the forward or reverse buffer is activated to pass the transition through the bus-interface chip. After a delay, the driver transistor is disabled. An optional bus-hold circuit maintains voltage levels on buses when driver transistors are disabled. The delay can be selectable by shorting delay resistors in the delay circuit. The high-level voltages on the two busses may differ. The bus-interface chip converts one voltage domain to another and can re-generate weak signals. A pre-buffer may be added to gradually step up the voltage level when differences in voltage domains are large.

20 Claims, 9 Drawing Sheets

BUS RELAY AND VOLTAGE SHIFTER WITHOUT DIRECTION CONTROL INPUT

BACKGROUND OF INVENTION

This invention relates to integrated circuits (IC's), and more particularly to voltage-converter and bus relays without a direction control input.

Continued shrinking of physical device sizes in integrated circuit (IC) chips has necessitated the reduction of power-supply voltages. Smaller voltages are needed to prevent punch-through or other breakdown and failure of the smaller, more delicate transistors.

Power-supply voltages have been gradually lowered over the last several years, from 5.0-volts to 3.3, 2.5, 1.8, 1.5, and 1.2 volts. The result is that some IC chips operate with 3.3-volt signals, while others operate with 1.8-volt or other signal voltages. A designer of an electronic system may need to use IC chips with different signal-voltage levels. The system-level designer must carefully design interfaces between the different voltage domains. For example, a 1.8-volt microprocessor may need to be interfaced with bus-logic chips that use 2.5-volt signals.

Bus-interface chips may be placed between the different voltage domains.

These bus-interface chips can convert signals from one voltage to another. For example, a logic high signal of 2.5 volts can be stepped down to 1.8 volt, while logic lows of zero volts are passed through. In the reverse direction, a 1.8-volt input can be converted to a 2.5-volt output.

Often a direction control signal must be inputted to the bus-interface chip. FIG. 1 shows a bit slice of a bus-interface chip with a direction-control input. Bus-interface chip 10 converts signals between bus A and bus B.

An input signal such as direction (DIR) is generated by external bus-control logic. Input DIR is buffered by inverter 16 and enables forward buffer 14 and disables reverse buffer 12 when DIR is low, but enables reverse buffer 12 and disables forward buffer 14 when DIR is high. When DIR is high, external driver 26 drives a signal to bus B, which is buffered by reverse buffer 12 to drive bus A. Input buffer 22 reads this signal on bus A.

When DIR is low, external driver 20 drives a signal to bus A, which is buffered by forward buffer 14 to drive bus B. Input buffer 24 reads this signal on bus B.

Bus A and B may operate at the same high-level voltage, or may operate at different voltages. For example, the power-supply for bus A may be applied to reverse buffer 12, while the power-supply voltage for bus B is applied to forward buffer 14.

When the high-level bus voltages are the same, bus-interface chip 10 is considered to be a bus relay device. When the high-level voltages on the two busses are different, bus interface chip 10 is considered to be a voltage converter or voltage shifter.

While such a bus interface is useful, external generation of the direction control signal DIR may be difficult for some systems. Bus-handshake, timing, or strobe signals may need to be sampled from a microprocessor or other bus-master device to determine in what direction the signals are propagating and when.

Some systems and bus protocols may not have clear-cut signals that can be used to generate the direction signal. Some bus protocols may not have the direction signal while there is a need for connecting devices working at different voltages. There is also a need to use a buffer to extend the wiring trace for longer distance, or to use a buffer for higher speeds and for connecting more devices, while the direction signal is not available in some protocols. Communication relays may receive only data without timing or control signals. Timing may be unspecified when delays are large. Bus conflicts or contention may occur when two buffers drive the same bus line, such as can occur if the direction control input is in the wrong state, even for a short period of time. Damage may result to the devices.

What is desired is a bus-interface chip that does not have a direction-control input. A bi-directional bus-interface chip is desired that automatically determines direction without examining an externally-generated direction-control input. A voltage shifter without a direction-control input is desirable.

DETAILED DESCRIPTION

The present invention relates to an improvement in bus interfaces. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
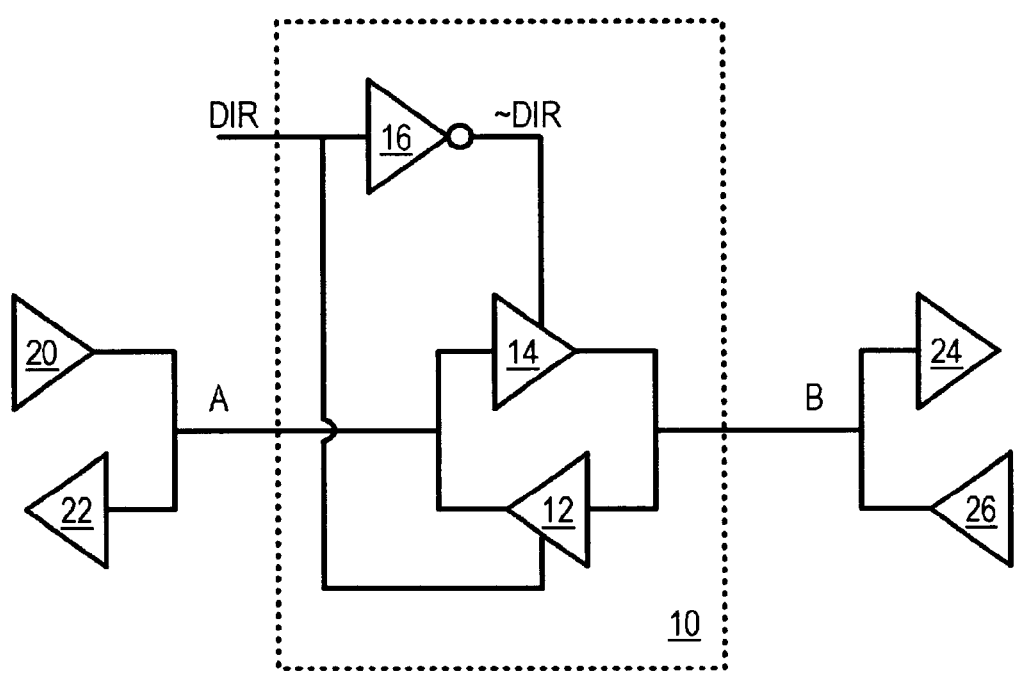
FIG. 1 shows a bit slice of a bus-interface chip with a direction-control input.
Figure 2:
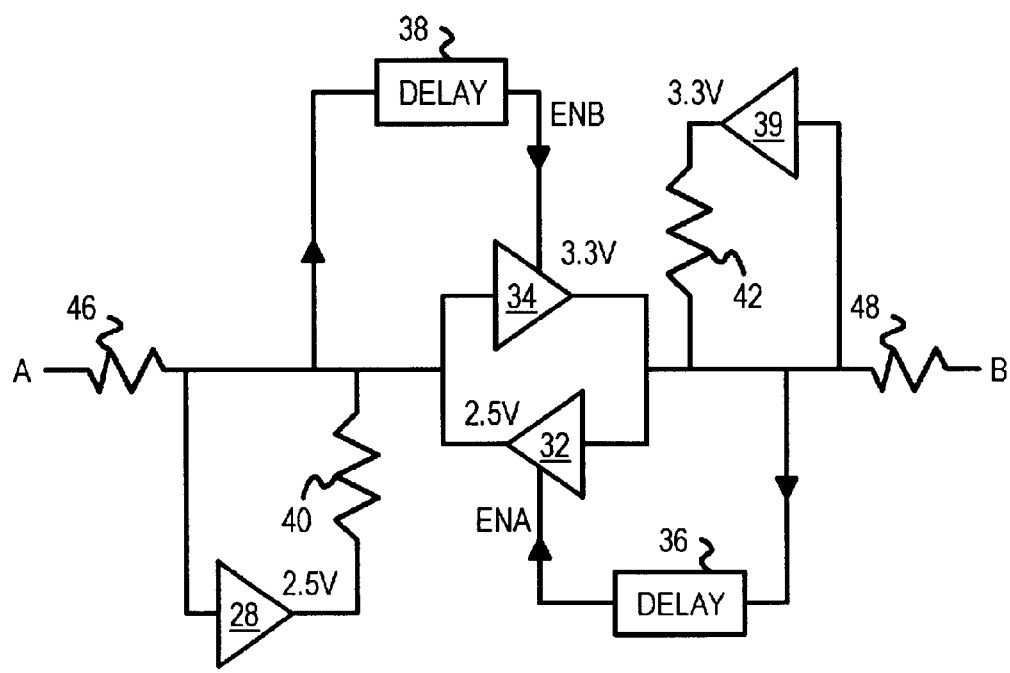
FIG. 2 is a block diagram of a bit-slice of a bus-interface chip without a direction-control input.

FIG. 2 is a block diagram of a bit-slice of a bus-interface chip without a direction-control input. An actual bus-interface may have many more bit-slices such as the slice shown, such as for an 8-bit-wide or 32-bit wide bus-interface chip. The bit slice may also be integrated with other logic or sub-systems on a larger chip.

Bus interface chip 30 converts high-level 2.5-volt signals on bus A to 3.3-volt high-level signals on bus B in this example. Other high-level voltages could be substituted. Forward buffer 34 operates with a 3.3-volt power supply so that its output high voltage to bus B is near 3.3 volts, the high-level for bus B. Reverse buffer 32 operates with a 2.5-volt power supply so that its output high voltage to bus A is near 2.5 volts, the high-level for bus A. Each buffer can accept input voltages above or below its output voltage when CMOS gates are used as inputs.

Forward buffer 34 and reverse buffer 32 are normally in the disabled or high-impedance (high-Z) state so that they do not drive their outputs. This allows external drivers to freely drive bus A or bus B.

When an external driver on bus A drives bus A to a new logic state, such as from low to high, or from high to low, the change in the state of bus A is passed through delay 38 and activates enable signal ENB. Enable signal ENB then activates forward buffer 34, which drives the new signal on bus A to bus B. A high signal at about 2.5 volts on bus A is converted to a high signal of about 3.3 volts on bus B by forward buffer 34.

After a delay period set by delay 38, enable signal ENB turns off again. Forward buffer 34 again becomes disabled and no longer drives bus B. Instead, bus B is held in the most-recent state by a bus-hold circuit. Hold buffer 39 is a non-inverting and weakly-driving buffer that provides feedback to bus B through bus-hold resistor 42. Since forward buffer 34 has a much greater current drive than hold buffer 39 limited by bus-hold resistor 42, forward buffer 34 can easily change the logic state of bus B. Limiting resistor 48 in series on bus B allows forward buffer 34 to set the bus-hold circuit even when large capacitances exist externally on bus B. Current from external drivers on bus B is also limited by limiting resistor 48.

For the reverse direction, when an external driver on bus B drives bus B to a new logic state, such as from low to high, or from high to low, the change in the state of bus B is passed through delay 36 and activates enable signal ENA. Enable signal ENA then momentarily activates reverse buffer 32, which drives the new signal on bus B to bus A. A high signal at about 3.3 volts on bus B is converted to a high signal of about 2.5 volts on bus A by reverse buffer 32.

After a delay period set by delay 36, enable signal ENA turns off again. Reverse buffer 32 again becomes disabled and no longer drives bus A. Instead, bus A is held in the most-recent state by a bus-hold circuit. Hold buffer 28 is a non-inverting and weakly-driving buffer that provides feedback to bus A through bus-hold resistor 40. Since reverse buffer 32 has a much greater current drive than hold buffer 28 limited by bus-hold resistor 40, reverse buffer 32 can easily change the logic state of bus A. Limiting resistor 46 in series on bus A allows reverse buffer 32 to set the bus-hold circuit even when large capacitances exist externally on bus A. Current from external drivers on bus A is also limited by limiting resistor 46.

Figure 3A:
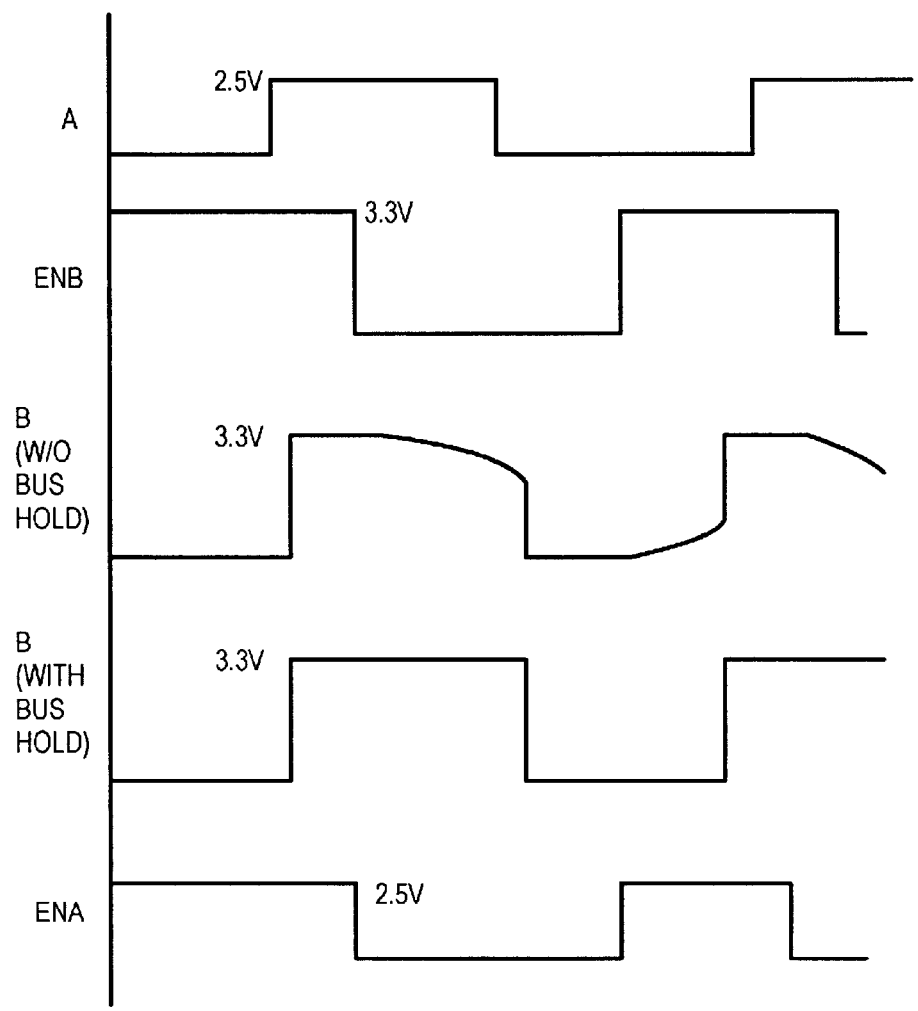
FIGS. 3A, B are waveforms of a bus-interface chip without a direction input.

FIGS. 3A, B are waveforms of a bus-interface chip without a direction input. In FIG. 3A, bus A operates with a 2.5-volt high level while bus B operates with a 3.3-volt high level. When bus A changes from low-to-high, the forward buffer becomes enabled and drives bus B high. After a delay, the enable signal ENB falls low, disabling the forward buffer. However, when bus A goes low, the forward buffer is again enabled, driving bus B low. After another delay enable ENB goes high, disabling the forward buffer.

Note that the enable signal ENB disables the forward buffer after a delay form each change, regardless of the absolute logic level, high or low. Changes in enable signal ENB disable the forward buffer, rather than the absolute logic state of the enable signal.

Without the bus-hold circuit, leakage on bus B could eventually lead to a decay in the high-voltage level and in the low-voltage level as shown in the third waveform. When the bus-hold circuit is used, logic levels are maintained.

Figure 3B:
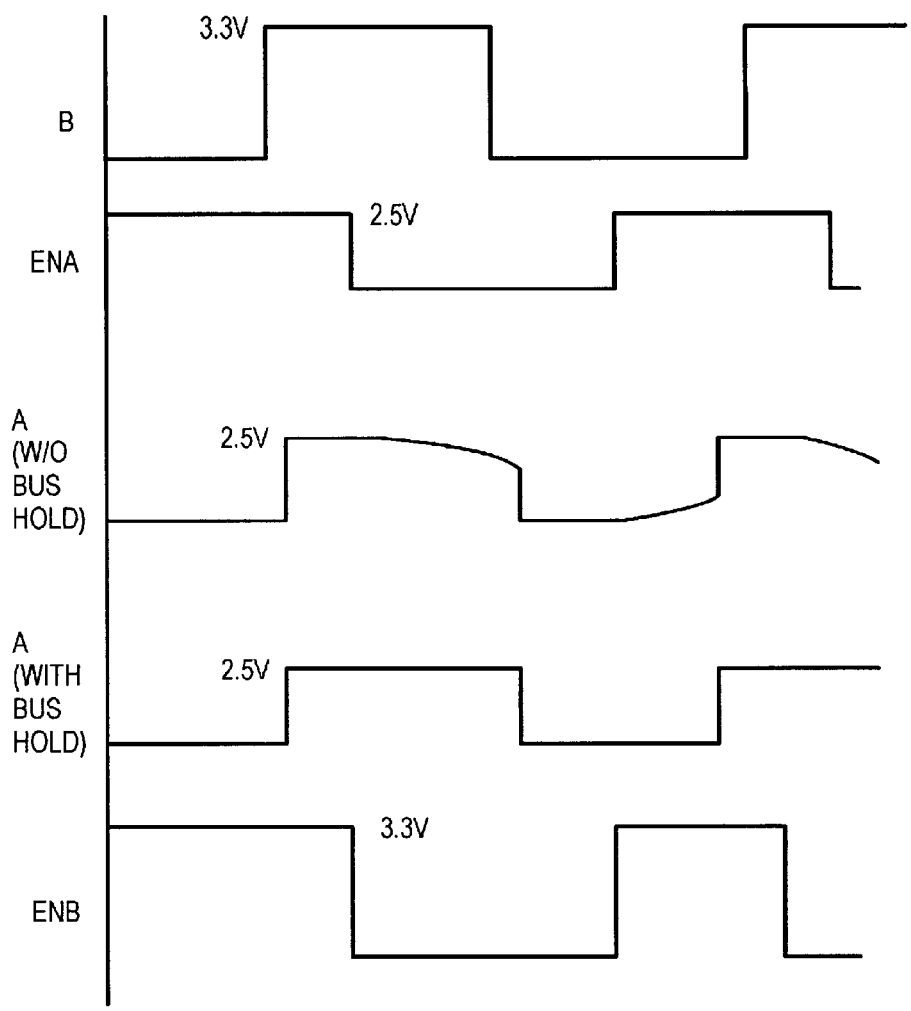

In FIG. 3B, when an external driver drives bus B to the opposite state, the reverse buffer drives bus A to the opposite state, such as shown in FIG. 3B. After a delay, enable signal ENA switches, disabling the reverse buffer.

Figure 4:
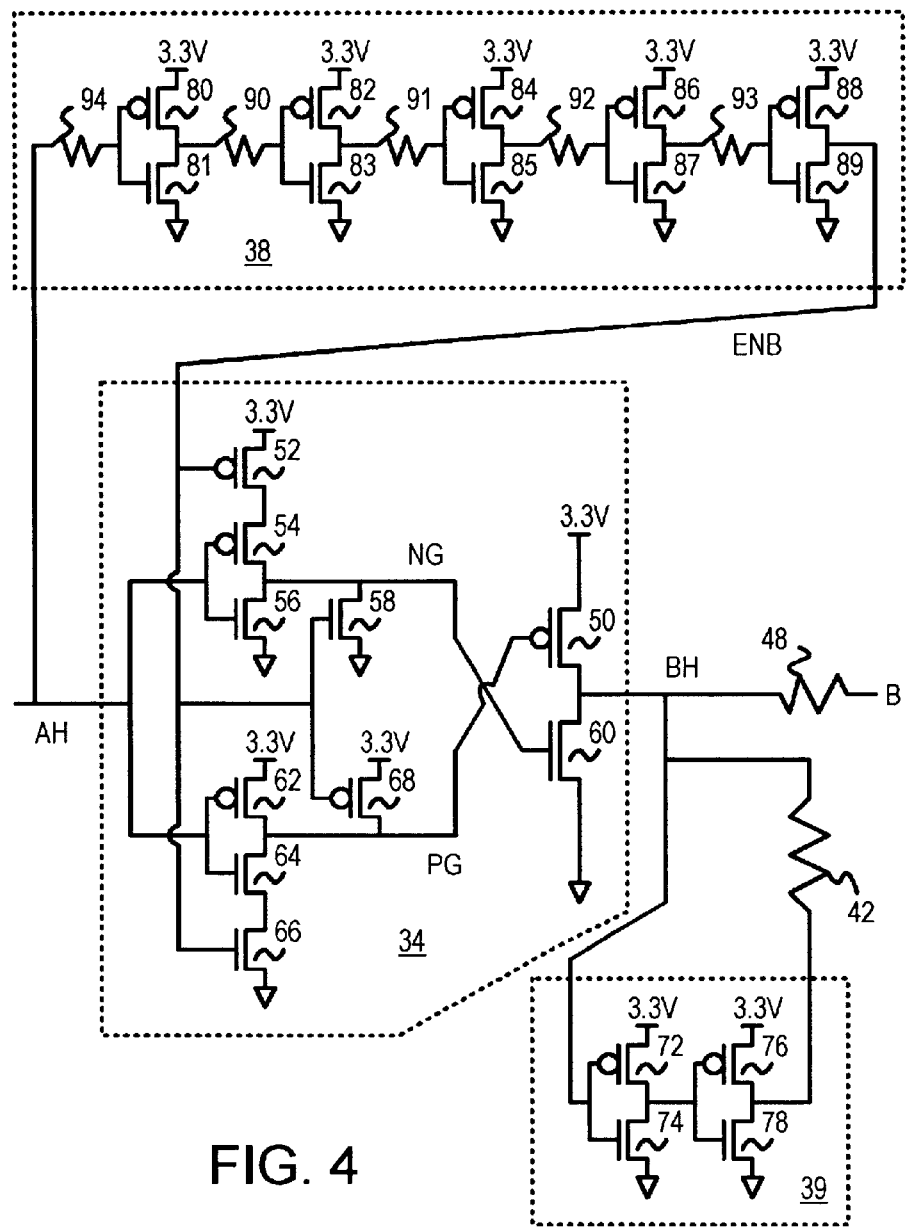
FIG. 4 shows a schematic of a forward buffer, delay, and bus-hold circuit without a direction-control input.

FIG. 4 shows a schematic of a forward buffer, delay, and bus-hold circuit without a direction-control input. Bus input AH is input to resistor 94 and transistors 80, 81 of delay 38, which delays changes in bus A through resistors 90, 91, 92, 93 which alternate with inverters of p-channel and n-channel transistors 80–89. Delay 38 outputs enable signal ENB. ENB changes after a typical delay of 3 to 7 nanoseconds (ns) but could have other target delays.

Forward buffer 34 contains a NAND gate of p-channel transistors 62, 68 and n-channel transistors 64, 66, and a NOR gate of p-channel transistors 52, 54 and n-channel transistors 56, 58. Each NAND and NOR gate receives the un-delayed bus A input on one p-channel and one n-channel transistor, and receives the delayed enable signal ENB on the other p-channel and n-channel transistor.

The output of the NOR gate is node NG, which is applied to the gate of n-channel driver transistor 60. The output of the NAND gate is node PG, which is applied to the gate of p-channel driver transistor 50. Driver transistors 50, 60 have their drains at node BH, the internal bus B node before limiting resistor 48.

Bus-hold buffer 39 includes p-channel transistors 72, 76 and n-channel transistors 74, 78 configured as a series of two inverters having an input from node BH and an output back to node BH through bus-hold resistor 42. The current drive of driver transistors 50, 60 is much larger than the drive of transistors 76, 78.

The sources of p-channel transistors 50, 52, 62, 68, 72, 76 connect to the bus B power-supply voltage, 3.3 volts. Thus bus B is driven high to near 3.3 volts, minus a voltage drop through limiting resistor 48 when current is sunk externally on bus B.

In operation, initially when bus A is low, enable ENB is in the inverse state (high) and p-channel transistors 54, 62 and n-channel transistors 58, 66 are on. P-channel transistor 62 pulls node PG high, keeping p-channel driver transistor 50 off. N-channel transistor 58 pulls node NG low, keeping n-channel driver transistor 60 off. Thus forward buffer 34 is initially disabled.

When bus A goes from low to high, n-channel transistors 56, 64 turn on. Before the delay through delay 38 has occurred, enable signal ENB is in the inverse of the old bus-A state (ENB is high). The initially high ENB has n-channel transistors 58, 66 turned on. Node NG is kept low by n-channel transistor 58, keeping n-channel driver transistor 60 off. However, node PG is pulled from high to low by n-channel transistors 64, 66, which are both on. The low PG turns on p-channel driver transistor 50, pulling bus B high.

After the delay time through delay 38, enable signal ENB goes low. N-channel transistor 66 turns off while p-channel transistor 68 turns on, driving node PG high, and turning off p-channel driver transistor 50. Thus bus B is again floating, with bus-hold buffer 39 keeping bus B in the high state until the next transition.

When bus A goes from high to low, p-channel transistors 54, 62 turn on. Before the delay through delay 38 has occurred, enable signal ENB is in the inverse of the old bus-A state (ENB is low). The initially low ENB has p-channel transistors 52, 68 turned on. Node PG is kept high by p-channel transistor 68, keeping p-channel driver transistor 50 off. However, node NG is pulled from low to high by p-channel transistors 52, 54, which are both on. The high NG turns on n-channel driver transistor 60, pulling bus B low.

After the delay time through delay 38, enable signal ENB goes high. P-channel transistor 52 turns off while n-channel transistor 58 turns on, driving node NG low, and turning off n-channel driver transistor 60. Thus bus B is again floating, with bus-hold buffer 39 keeping bus B in the low state until the next transition.

External drivers can be required by design specifications not to simultaneously drive the bus. Thus bus contention can be avoided.

Figure 5:
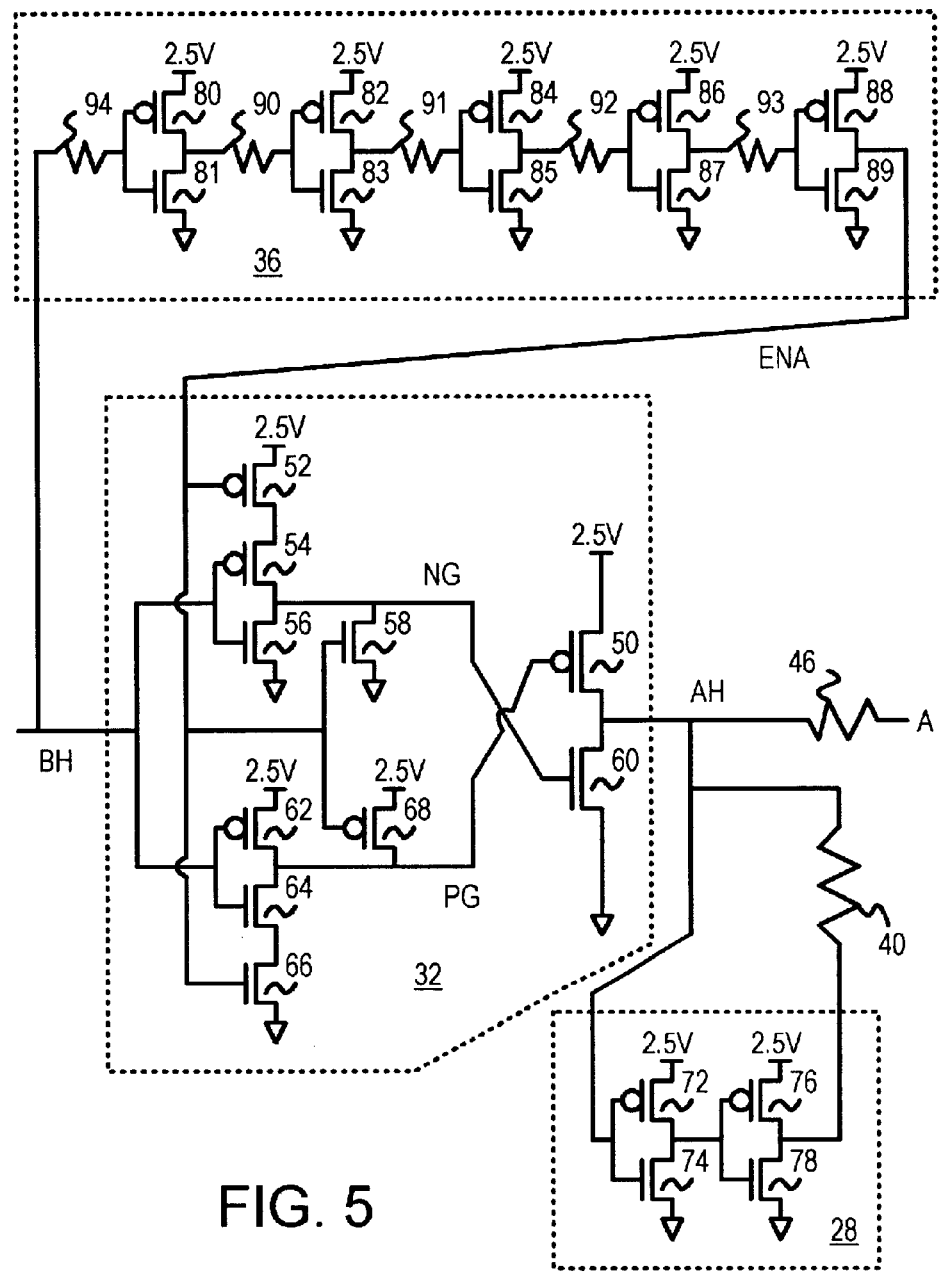
FIG. 5 shows a schematic of a reverse buffer, delay, and bus-hold circuit without a direction-control input.

FIG. 5 shows a schematic of a reverse buffer, delay, and bus-hold circuit without a direction-control input. The same transistor-level circuits can be used for reverse buffer 32 as for forward buffer 34, but with buses A and B reversed. Likewise delay 36 can be constructed from the same transistor-level circuit arrangement as delay 38, as can the bus-hold circuit. Two instances of the circuits can be used for each bi-directional bit slice, one for the forward direction and the other for the reverse direction. Operation is similar to that already described.

Bus input BH is input to resistor 94 and transistors 80, 81 of delay 36, which delays changes in bus B through resistors 90, 91, 92, 93 which alternate with inverters of p-channel and n-channel transistors 80–89. Delay 36 outputs enable signal ENA. ENA changes after a typical delay of 3 to 7 nanoseconds (ns) but could have other target delays.

Reverse buffer 32 contains a NAND gate of p-channel transistors 62, 68 and n-channel transistors 64, 66, and a NOR gate of p-channel transistors 52, 54 and n-channel transistors 56, 58. Each NAND and NOR gate receives the un-delayed bus B input on one p-channel and one n-channel transistor, and receives the delayed enable signal ENA on the other p-channel and n-channel transistor.

Bus-hold buffer 28 contains two inverters of p-channel transistors 72, 76 and n-channel transistors 74, 78, and receive internal bus AH as input and feedback to internal bus AH through bus-hold resistor 40. Limiting resistor 46 limits current from external drivers on external bus A.

The sources of p-channel transistors 50, 52, 62, 68, 72, 76 connect to the bus A power-supply voltage, 2.5 volts. Thus bus A is driven high to near 2.5 volts, minus a voltage drop through limiting resistor 46 when current is sunk externally on bus A. Delay 36 can also use the bus-A voltage as shown, but could use the bus-B voltage.

Figure 6:
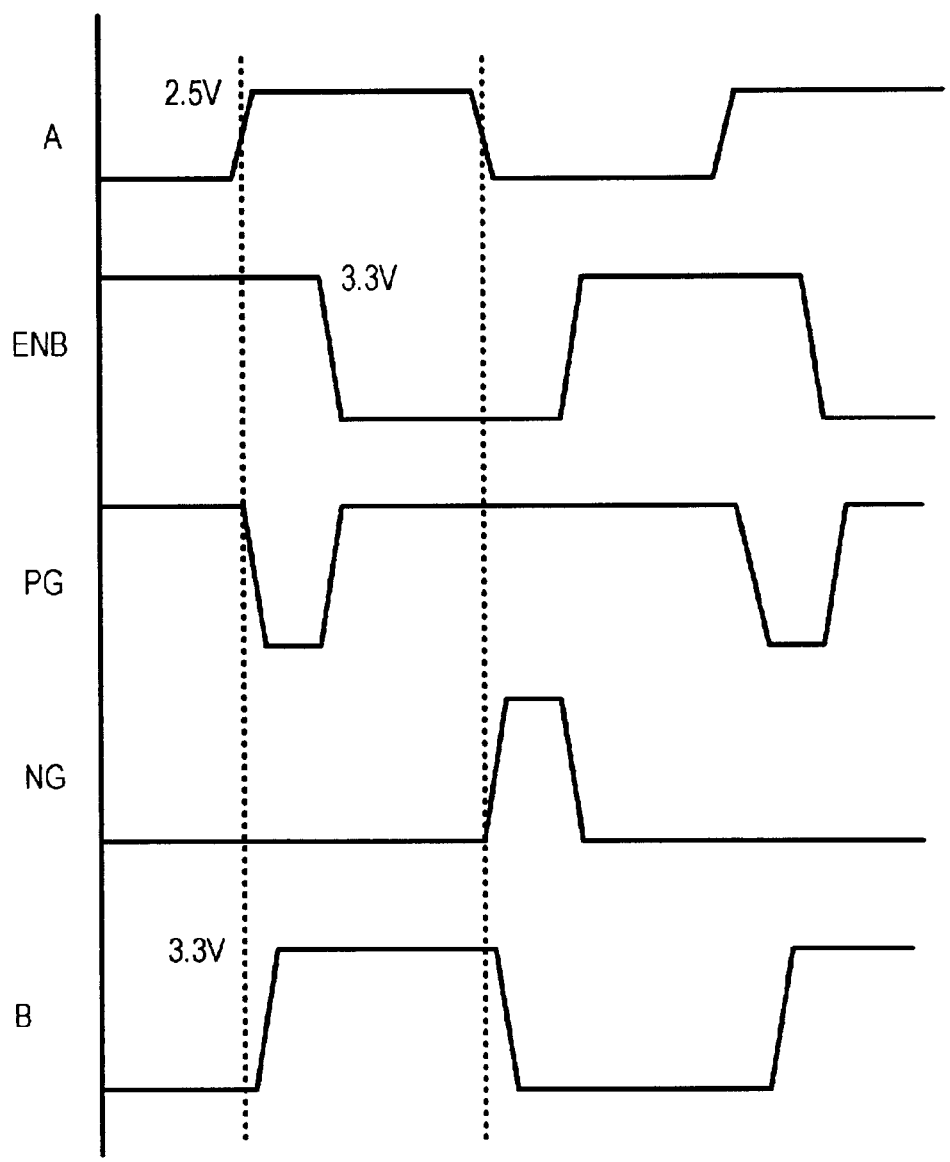
FIG. 6 is a waveform of operation of the forward buffer of FIG. 4.

FIG. 6 is a waveform of operation of the forward buffer of FIG. 4. Bus A is externally driven from 2.5-volt high levels to ground. After a delay, enable signal ENB toggles to the inverse state of bus A. Transitions of enable signal ENB terminate drive pulses PG, NG to the gates of the p-channel and n-channel driver transistors that drive to bus B. It is the transitions, rather than the absolute level of enable signal ENB that terminates drive.

When bus A goes high, node PG goes low, causing the p-channel driver transistor to drive bus B high. After a delay, enable signal ENB goes low, causing node PG to go high again, disabling the p-channel driver transistor and ending the drive period of the forward buffer. Bus B remains high after the pulse on node PG ends since the bus-hold circuit holds bus B high in the absence of external drivers.

When bus A goes low, node NG goes high, causing the n-channel driver transistor to drive bus B low. After a delay, enable signal ENB goes high, causing node NG to go low again, disabling the n-channel driver transistor and ending the drive period of the forward buffer. Bus B remains low after the pulse on node NG ends since the bus-hold circuit holds bus B low in the absence of external drivers.

Bus B is driven high to 3.3 volts, since the delay and forward buffers use a 3.3-volt power supply. Internal signal NG, PG, ENB have 3.3-volt high levels.

Figure 7:
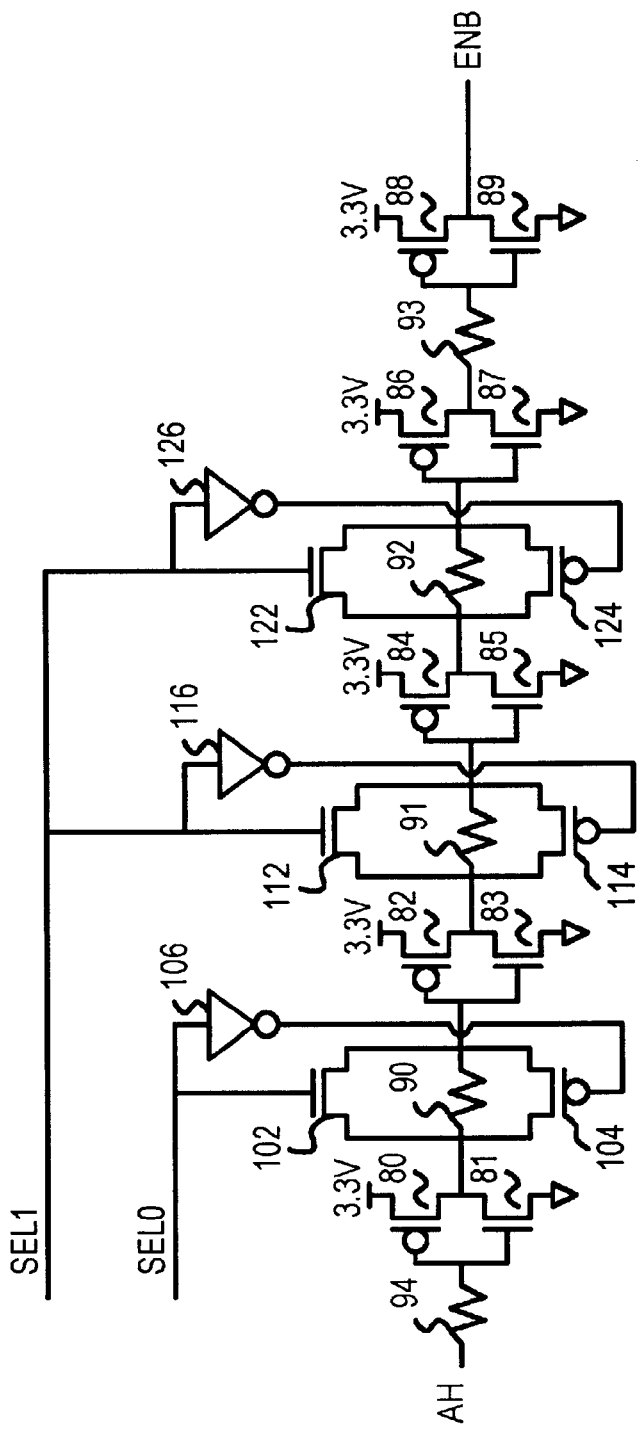
FIG. 7 is a delay circuit with a selectable delay.

FIG. 7 is a delay circuit with an adjustable delay. Sometimes it is desirable to be able to adjust the delay until the drivers are disabled. A programmable register or external inputs can drive select signals SEL0, SEL1, allowing a system designer to adjust the delay and the amount of time that the forward or reverse buffer is enabled after a bus transition occurs.

Programmable delay circuit 100 can replace delay 36, 38 in the earlier figures. Bus-input node AH is inverted five times to generate enable signal ENB, which is the inverse of bus A. When SEL0 and SEL1 are both low, transmission gate transistors 102, 104, 112, 114, 122, 124 are all off. Input AH drives the gates of p-channel and n-channel transistors 80, 81 through resistor 94. The gates of transistors 82, 83 are driven by the drains of transistors 80, 81 through resistor 90 since transmission gate transistors 102, 104 are off. Then the gates of transistors 84, 85 are driven by the drains of transistors 82, 83 through resistor 91 since transmission gate transistors 112, 114 are off. The gates of transistors 86, 87 are driven by the drains of transistors 84, 85 through resistor 92 since transmission gate transistors 122, 124 are off. Finally the gates of transistors 88, 89 are driven by the drains of transistors 86, 87 through resistor 93.

The maximum delay occurs when SEL0 and SEL1 are both low. When SEL0 is high and SEL1 low, transmission gate transistors 102, 104 turn on as inverter 106 drives a low to p-channel transistor 104. Since transmission gate transistors 102, 104 are in parallel with resistor 90, the effective resistance is reduced, reducing the delay. Thus the delay is reduced somewhat by shorting resistor 90 when SEL0 is high.

When SEL1 is high but SEL0 is low, resistors 91, 92 are both shorted. Inverter 116 turns on p-channel transistor 114 while inverter 126 turns on p-channel transistor 124. Transmission gate transistors 112, 114 short resistor 91, while transmission gate transistors 122, 124 short resistor 92. Since two resistors are shorted, delay is reduced further.

When both SEL0 and SEL1 are high, three resistors 90, 91, 92 are shorted. This produces the most reduced delay. Thus delay can be reduced by shorting one, two, or three resistors in the delay line. The selectable delays can be optimized for desired bus frequencies, such as for 33, 66, 100, or 133 MHz buses.

Figure 8:
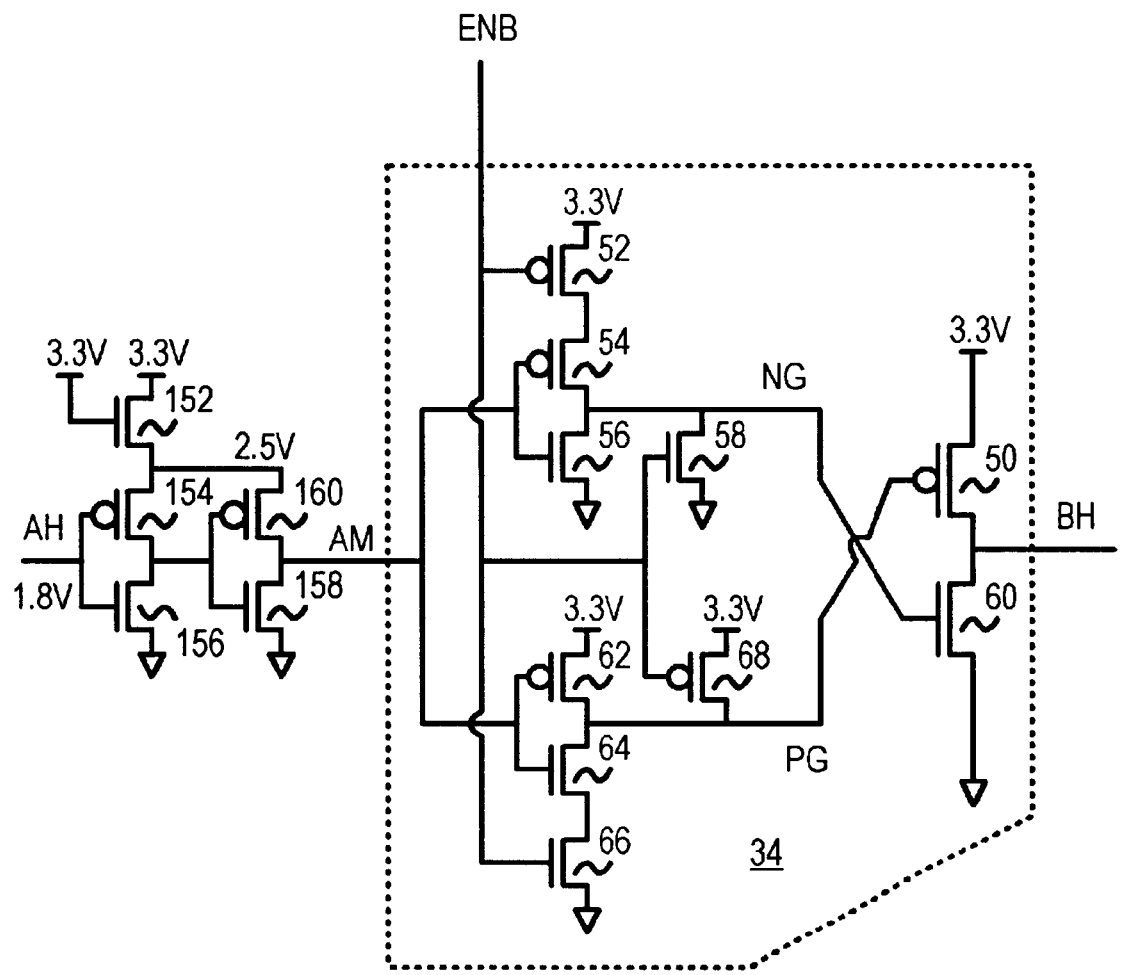
FIG. 8 is a schematic of a forward buffer with a pre-buffer to step up a very low input voltage.

FIG. 8 is a schematic of a forward buffer with a pre-buffer to step up a very low input voltage. Forward buffer 34 uses a 3.3-volt power supply and operates as described before in FIG. 4 with enable ENB generated from a delay from either nodes AH or AM. Since the high level on bus A is at a very reduced 1.8 volt, a prebuffer is used to shift up the 1.8-volt high signal on bus AH to a middle voltage of 2.5 volt at node AM.

N-channel shift transistor 152 has its gate and drain connected to the 3.3-volt power supply for output bus B. The source of shift transistor 152 is about a threshold voltage below 3.3 volts, or about 2.5 volts. This threshold is increased by the body effect since the body or substrate of n-channel shift transistor 152 is at ground but it's source is at a higher voltage (2.5 volts) above ground.

The 2.5-volt source of shift transistor 152 connects to the sources of p-channel transistors 154, 160. P-channel transistors 154, 160 can pull their outputs high to only the limited 2.5 volts. The logic switching threshold of the inverters of transistors 154, 156 and transistors 160, 158 are shifted downward by shift transistor 154. Thus transistors 152, 156 have a switching threshold at about 0.9 volt, which is near half of 1.8 volt, rather than half of 3.3 volt.

Noise margins are improved by using such a pre-buffer to more gradually step up reduced high-level voltages to higher power-supply voltages.

ALTERNATE EMBODIMENTS

Several other embodiments are contemplated by the inventor. For example other circuit arrangements can be used, and additional devices such as capacitors, resistors, transistors, and circuits can be added at various locations. Additional inverters or buffers could be added at various locations in the circuit to buffer or invert signals.

The delay p-channel transistors could connect to the other power-supply voltage for the input bus rather than for the output bus, or could connect to another voltage. Lower power-supply voltages can increase delays, which may be beneficial in some embodiments. Limiting resistors can be internal or external to the bus-interface chip and may be deleted in some embodiments.

Other methods to adjust the delay can be used, such as fuses, trimmed resistors, adjustable capacitors, etc. Series or parallel components can be used. Other, perhaps more advanced, kinds of transistors can be substituted.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A bus-interface chip without a direction-control input comprising:
   a plurality of bit slices between bits of a first bus and corresponding bits of a second bus, each bit slice comprising:
   a forward buffer having an input coupled to a first bus line that is a bit of the first bus and an output for driving a second bus line that is a bit of the second bus;
   a first delay, coupled to the first bus line, for generating a first delayed signal after a delay from a transition on the first bus line;
   the forward buffer being enabled to drive the second bus line in response to the transition on the first bus line, the forward buffer being disabled from driving the second bus line in response to the first delayed signal;
   a reverse buffer having an input coupled to the second bus line and an output for driving the first bus line; and
   a second delay, coupled to the second bus line, for generating a second delayed signal after a delay from a transition on the second bus line;
   the reverse buffer being enabled to drive the first bus line in response to the transition on the second bus line, the reverse buffer being disabled from driving the first bus line in response to the second delayed signal,
   whereby the forward buffer and the reverse buffer are enabled and disabled without using a direction-control input to the bus-interface chip.

2. The bus-interface chip of claim 1 wherein the transition on the first bus line is a rising or a falling transition,
   wherein the forward buffer is enabled by both rising and falling transitions of the first bus line;
   wherein the transition on the second bus line is a rising or a falling transition,
   wherein the reverse buffer is enabled by both rising and falling transitions of the second bus line.

3. The bus-interface chip of claim 2 further comprising:
   a first bus-hold buffer, having an input coupled to the second bus line, for driving feedback to the second bus line to maintain a signal level on the second bus line after the forward buffer is disabled by the first delayed signal;
   a second bus-hold buffer, having an input coupled to the first bus line, for driving feedback to the first bus line to maintain a signal level on the first bus line after the reverse buffer is disabled by the second delayed signal.

4. The bus-interface chip of claim 3 further comprising:
   a first power-supply voltage for a first voltage domain of the first bus;
   a second power-supply voltage for a first voltage domain of the second bus;
   wherein the first power-supply voltage is greater than the second power-supply voltage;
   wherein the forward buffer receives the second power-supply voltage that is a high-level voltage of the second bus;
   wherein the reverse buffer receives the first power-supply voltage that is a high-level voltage of the first bus,
   whereby voltage conversion is performed between the first and second bus.

5. The bus-interface chip of claim 4 wherein the reverse buffer further comprises:
   a pre-buffer, coupled to the second bus line, for stepping up high-level voltages at the second power-supply voltage to an intermediate voltage between the first and second power-supply voltages,
   whereby the pre-buffer between the second bus line and the first bus line steps up voltages to the intermediate voltage.

6. The bus-interface chip of claim 5 wherein the pre-buffer comprises:
   a shift transistor, having a gate and a drain coupled to the first power-supply voltage, and a source coupled to a source of a p-channel transistor that receives the second bus line at a gate.

7. The bus-interface chip of claim 4 wherein the first delay and the second delay are inverting, the first delayed signal being an inverse of the first bus line and the second delayed signal being an inverse of the second bus line at steady-state.

8. The bus-interface chip of claim 7 wherein the forward buffer comprises:
   a forward NOR gate that receives as inputs the first bus line and the first delayed signal, and outputs a first forward gate signal;
   a forward NAND gate that receives as inputs the first bus line and the first delayed signal, and outputs a second forward gate signal;
   a first pull-up transistor controlled by the second forward gate signal, for driving the second bus line high when the first bus line transitions high and before the first delayed signal falls;
   a first pull-down transistor controlled by the first forward gate signal, for driving the second bus line low when the first bus line transitions low and before the first delayed signal rises.

9. The bus-interface chip of claim 8 wherein the reverse buffer comprises:
   a reverse NOR gate that receives as inputs the second bus line and the second delayed signal, and outputs a first reverse gate signal;
   a reverse NAND gate that receives as inputs the second bus line and the second delayed signal, and outputs a second reverse gate signal;
   a second pull-up transistor controlled by the second reverse gate signal, for driving the first bus line high when the second bus line transitions high and before the second delayed signal falls;
   a second pull-down transistor controlled by the first reverse gate signal, for driving the first bus line low when the second bus line transitions low and before the second delayed signal rises.

10. A bi-directional interface circuit comprising:
    a first bi-directional input;
    a second bi-directional input;
    a first delay circuit, coupled to the first bi-directional input, for generating a first delay signal having delayed transitions after a delay from transitions of the first bi-directional input;
    a forward buffer comprising:
        a forward NAND gate, coupled to the first bi-directional input and to the first delay signal, for generating a forward p-gate signal;
        a forward p-channel driver transistor, driven by the forward p-gate signal, for driving the second bi-directional input high;
        a forward NOR gate, coupled to the first bi-directional input and to the first delay signal, for generating a forward n-gate signal;
        a forward n-channel driver transistor, driven by the forward n-gate signal, for driving the second bi-directional input low;
    a second delay circuit, coupled to the second bi-directional input, for generating a second delay signal having delayed transitions after a delay from transitions of the second bi-directional input;
    a reverse buffer comprising:
        a reverse NAND gate, coupled to the second bi-directional input and to the second delay signal, for generating a reverse p-gate signal;
        a reverse p-channel driver transistor, driven by the reverse p-gate signal, for driving the first bi-directional input high;
        a reverse NOR gate, coupled to the second bi-directional input and to the second delay signal, for generating a reverse n-gate signal;
        a reverse n-channel driver transistor, driven by the reverse n-gate signal, for driving the first bi-directional input low.

11. The bi-directional interface circuit of claim 10 wherein the first delay circuit and the second delay circuit are inverting;
    wherein the first delay signal has an inverse logic state from the first bi-directional input when no transitions occur;
    wherein the second delay signal has an inverse logic state from the second bi-directional input when no transitions occur.

12. The bi-directional interface circuit of claim 11 wherein the first delay circuit and the second delay circuit have selectable delays that are controlled by delay-select signal.

13. The bi-directional interface circuit of claim 12 wherein the first and second delay signals have delayed transitions that occur 3 to 7 nanoseconds after the transitions of the first or second bi-directional input.

14. The bi-directional interface circuit of claim 13 wherein the reverse buffer operates at a first voltage applied to a power-supply input to the reverse buffer;
    wherein the forward buffer operates at a second voltage applied to a power-supply input to the forward buffer;
    wherein the first voltage and the second voltage are different voltages.

15. The bi-directional interface circuit of claim 14 wherein the first voltage is 3.3 volts, 2.5 volts, or 1.8 volts, while the second voltage is 2.5 volts, or 1.8 volts.

16. A bus relay comprising:
    a first input and a second input;
    first delay means for delaying transitions on the first input to generate a first delayed input;
    forward buffer means, coupled to the first input and to the first delayed input, for driving the second input high to a second voltage immediately after the first input transitions high and before the first delayed input transitions in response to the first input transitioning high, and for driving the second input low to a ground voltage immediately after the first input transitions low and before the first delayed input transitions in response to the first input transitioning low;
    second delay means for delaying transitions on the second input to generate a second delayed input; and
    reverse buffer means, coupled to the second input and to the second delayed input, for driving the first input high to a first voltage immediately after the second input transitions high and before the second delayed input transitions in response to the second input transitioning high, and for driving the first input low to a ground voltage immediately after the second input transitions low and before the second delayed input transitions in response to the second input transitioning low,
    whereby the first and second input are bi-directionally buffered without a direction-control input.

17. The bus relay of claim 16 wherein the first voltage is higher than the second voltage, the bus relay being a voltage shifter.

18. The bus relay of claim 17 further comprising:
    first bus-hold means, coupled to the first input, for maintaining a voltage level of the first input when the reverse buffer means is no longer driving the first input;

second bus-hold means, coupled to the second input, for maintaining a voltage level of the second input when the forward buffer means is no longer driving the second input.

19. The bus relay of claim 18 wherein the first delay means and the second delay means includes inverting means wherein the first delayed input is a logical inverse of the first input when no transitions have occurred, and wherein the second delayed input is a logical inverse of the second input when no transitions have occurred.

20. The bus relay of claim 19 wherein the forward buffer means comprises:

forward NAND gate means for pulsing a forward p-gate node low immediately after the first input transitions high and before the first delayed input transitions low in response to the first input transitioning high;

forward NOR gate means for pulsing a forward n-gate node high immediately after the first input transitions low and before the first delayed input transitions high in response to the first input transitioning low;

forward p-channel transistor means, receiving the forward p-gate node, for driving the second input high to the second voltage when the forward p-gate node is pulsed low;

forward n-channel transistor means, receiving the forward n-gate node, for driving the second input low to the second voltage when the forward n-gate node is pulsed high;

wherein the reverse buffer means comprises:

reverse NAND gate means for pulsing a reverse p-gate node low immediately after the second input transitions high and before the second delayed input transitions low in response to the second input transitioning high;

reverse NOR gate means for pulsing a reverse n-gate node high immediately after the second input transitions low and before the second delayed input transitions high in response to the second input transitioning low;

reverse p-channel transistor means, receiving the reverse p-gate node, for driving the first input high to the second voltage when the reverse p-gate node is pulsed low;

reverse n-channel transistor means, receiving the reverse n-gate node, for driving the first input low to the second voltage when the reverse n-gate node is pulsed high.

* * * * *